US012733108B2

(12) United States Patent
Schmid

(10) Patent No.: US 12,733,108 B2
(45) Date of Patent: Sep. 8, 2026

(54) METHOD OF PRODUCING PRINTED CIRCUIT BOARDS AND PRINTED CIRCUIT BOARDS PRODUCED IN ACCORDANCE WITH THE METHOD

(71) Applicant: Gebr. Schmid GmbH, Freudenstadt (DE)

(72) Inventor: Christian Schmid, Freudenstadt (DE)

(73) Assignee: Gebr. Schmid GmbH, Freudenstadt (DE)

( * ) Notice: Subject to any disclaimer, the term of this patent is extended or adjusted under 35 U.S.C. 154(b) by 0 days.

(21) Appl. No.: 17/624,082

(22) PCT Filed: Jun. 18, 2020

(86) PCT No.: PCT/EP2020/067042
§ 371 (c)(1),
(2) Date: Dec. 30, 2021

(87) PCT Pub. No.: WO2021/001167
PCT Pub. Date: Jan. 7, 2021

(65) Prior Publication Data

US 2022/0361341 A1 Nov. 10, 2022

(30) Foreign Application Priority Data

Jul. 4, 2019 (DE) ..................... 10 2019 209 889.4

(51) Int. Cl.
*H05K 3/10* (2006.01)
*H05K 1/02* (2006.01)
(Continued)

(52) U.S. Cl.
CPC ........... *H05K 3/107* (2013.01); *H05K 1/0298* (2013.01); *H05K 1/115* (2013.01); *H05K 3/0041* (2013.01);
(Continued)

(58) Field of Classification Search
CPC ...... H05K 3/465; H05K 3/107; H05K 3/4605; H05K 3/0041; H05K 1/0298
See application file for complete search history.

(56) References Cited

U.S. PATENT DOCUMENTS 4,556,628 A 12/1985 Greschner et al.
5,173,442 A 12/1992 Carey
(Continued)

FOREIGN PATENT DOCUMENTS

EP 0 127 689 A1 12/1984
EP 0 407 129 2/1990
(Continued)

OTHER PUBLICATIONS

Office Action dated Aug. 18, 2023, of counterpart Taiwanese Patent Application No. 109122330, along with an English translation.
(Continued)

*Primary Examiner* — Livius R. Cazan
(74) *Attorney, Agent, or Firm* — DLA Piper LLP (US)

(57) ABSTRACT

A method of producing a multilayer printed circuit board includes a metallic conductor structure including providing a base substrate including a film or plate and having first and second substrate sides, which base substrate at least partly consists of an electrically non-conductive organic polymer material and wherein the first substrate side is covered with a cover metal layer, partially removing the cover metal layer while subdividing the first substrate side into at least one first partial area, in which the first substrate side is free of the cover metal layer, and into at least one second partial area, in which the first substrate side is covered with the cover metal layer, and causing a plasma to act on the first substrate side with the aid of which plasma the polymer material is removed in the at least one first partial area while forming at least one trench.

17 Claims, 2 Drawing Sheets

(51) Int. Cl.

| | |
|---|---|
| ***H05K 1/11*** | (2006.01) |
| ***H05K 3/00*** | (2006.01) |
| ***H05K 3/46*** | (2006.01) |

(52) U.S. Cl.

CPC ... *H05K 3/465* (2013.01); *H05K 2201/09563* (2013.01)

(56) References Cited

U.S. PATENT DOCUMENTS

| | | | | |
|---|---|---|---|---|
| 5,244,538 | A | 9/1993 | Kumar | |
| 5,369,881 | A | 12/1994 | Inaba et al. | |
| 5,822,641 | A | 10/1998 | Furukawa | |
| 6,518,160 | B1 | 2/2003 | Fjelstad et al. | |
| 8,148,643 | B2 | 4/2012 | Hirose et al. | |
| 2005/0012217 | A1 * | 1/2005 | Mori | H01L 23/49822 257/E23.062 |
| 2006/0127686 | A1 * | 6/2006 | Meloni | H05K 1/0346 252/500 |
| 2006/0131176 | A1 | 6/2006 | Hsu | |
| 2012/0291275 | A1 | 11/2012 | Rha et al. | |
| 2013/0078806 | A1 | 3/2013 | Chen et al. | |
| 2014/0027163 | A1 * | 1/2014 | Min | H05K 3/4602 174/250 |
| 2015/0351235 | A1 | 12/2015 | Ogawa | |

FOREIGN PATENT DOCUMENTS

| | | | | | |
|---|---|---|---|---|---|
| JP | H03-35585 | | | 2/1991 | |
| JP | 07240568 | A | * | 9/1995 | |
| JP | H10-3171 | A | | 1/1998 | |
| JP | 11103171 | A | * | 4/1999 | H05K 3/422 |
| JP | 2005-332928 | | | 12/2005 | |
| KR | 20070086858 | A | | 8/2007 | |
| KR | 20100049842 | A | * | 5/2010 | |
| WO | 2012/132325 | A1 | | 10/2012 | |

OTHER PUBLICATIONS

Examination Report dated Aug. 31, 2023, of counterpart Indian Patent Application No. 202217005191.

Office Action dated Dec. 15, 2025, from counterpart European Application No. 20734156.1.

Office Action dated Jul. 2, 2024, of counterpart Japanese Patent Application No. 2021-572092, along with an English translation.

Office Action dated Dec. 13, 2024, from counterpart Korean Application No. 10-2022-7003720 with English Translation.

* cited by examiner

METHOD OF PRODUCING PRINTED CIRCUIT BOARDS AND PRINTED CIRCUIT BOARDS PRODUCED IN ACCORDANCE WITH THE METHOD

TECHNICAL FIELD

This disclosure relates to a method of producing printed circuit boards, and printed circuit boards produced in accordance with the method.

BACKGROUND

A printed circuit board (PCB) serves as a carrier for electronic components and ensures the electrical contacting thereof. Virtually every electronic device contains one or more printed circuit boards.

Printed circuit boards always comprise a base substrate, which is embodied in an electrically non-conductive fashion and has on at least one substrate side a structure composed of conductor tracks (conductor structure) for electrically contacting the electronic components. In general, base substrates for printed circuit boards consist of fiber-reinforced plastic, of plastic films or hard paper. The conductor tracks usually consist of a metal such as copper.

In the simplest form, only one side of the base substrate has a conductor structure. However, more complex circuits often require more than one conductor track plane; a multilayer printed circuit board (multilayer board (MLB)) is then required. In these instances, for example, both sides of a carrier layer can be provided with a conductor structure, or a plurality of base substrates each having a conductor track plane are combined to form an MLB. In particular, base substrates provided with a conductor structure on both sides can also form a basis for multilayer constructions. The conductor tracks of the different conductor track planes can be electrically connected to one another by way of vias. For this purpose, by way of example, holes can be drilled into the base substrates and the walls of the drilled holes can be metallized.

Formation of the conductor structures on a base substrate is usually carried out subtractively in a multi-stage photolithographic process using a photoresist (resist), the solubility of which in a developer solution can be influenced by radiation, in particular by UV radiation. In a routine procedure, a metal layer is formed on the base substrate and is covered with a layer of the photoresist. The layer of the photoresist can be laminated onto the metal layer, for example. Afterwards, the layer of the photoresist is subjected to the aforementioned radiation in an exposure step, wherein partial regions of the layer are protected against exposure to radiation by an exposure mask. Depending on the photoresist used and the developer solution used, after the exposure step either the exposed or the unexposed partial regions of the layer of the photoresist are soluble in the developer solution and can be removed in a subsequent step. In this subsequent step, the developer step, partial regions of the metal layer on the base substrate are uncovered, and they can be removed wet-chemically in a further subsequent step, an etching step. The remnants of the metal layer that remain after the resist has subsequently been completely removed form the desired conductor structure. Optionally, the latter can be reinforced in a deposition step, for example, by electrodeposition of a suitable metal.

Owing to the dictates of production, the conductor tracks are thus situated on the surface of a base substrate. This may be disadvantageous in the production of MLBs. If a surface of a base substrate provided with conductor tracks is pressed together with a further base substrate, afterwards there is often a need for monitoring and correction owing to deviations that are caused by the pressures and temperatures occurring during pressing. Conductor tracks on the surface of base substrates are subjected to such loading to a particular extent. The smaller the distances and dimensions of the conductor tracks on the substrate, the greater generally the corresponding need for monitoring and correction, for example, with regard to existing impedance and signal speed requirements.

A general disadvantage of the traditional subtractive processes, moreover, is that resolution of the conductor structures to be produced is limited. Conductor tracks having widths in the low two-digit or even one-digit μm range are thus virtually impossible to produce.

In recent years, additive and semi-additive approaches have increasingly also been employed to form conductor tracks (SAP: Semi-Additive Process and mSAP: Modified Semi-Additive Process). These approaches make it possible to produce conductor track structures with a higher resolution than is possible with subtractive processes. However, such progress is made at the expense of enormous technical complexity, which is reflected in losses of yield and high production costs.

It could therefore be helpful to develop a procedure for producing printed circuit boards which makes it possible to avoid or at least reduce the problems described.

SUMMARY

I provide a method of producing a multilayer printed circuit board including a metallic conductor structure, including: a. providing a base substrate including a film or plate and having a first substrate side and a second substrate side, which base substrate at least partly consists of an electrically non-conductive organic polymer material and wherein the first substrate side is covered with a cover metal layer, b. partially removing the cover metal layer while subdividing the first substrate side into at least one first partial area, in which the first substrate side is free of the cover metal layer, and into at least one second partial area, in which the first substrate side is covered with the cover metal layer, c. causing a plasma to act on the first substrate side with the aid of which plasma the polymer material is removed in the at least one first partial area while forming at least one trench, d. filling the at least one trench with a filling metal, and e. completely removing the cover metal layer in the at least one second partial area while forming a first conductor structure or a part of a first conductor structure, f. optionally planarizing the first substrate side with the at least one trench that has been filled, g. covering the first conductor structure with an insulation layer, which in a composite assembly with the base substrate has an underside directly in contact with the first conductor structure and a top side facing away from the first conductor structure and which at least partly consists of an electrically non-conductive organic polymer material, h. if not yet present, forming a cover metal layer on the top side of the insulation layer, i. partially removing the cover metal layer while subdividing the top side into at least one first partial area, in which the top side is free of the cover metal layer, and into at least one second partial area, in which the top side is covered with the cover metal layer, j. causing a plasma to act on the top side, with the aid of which plasma the polymer material is removed in the at least one first partial area while forming at least one trench, k. filling the at least one trench with a filling metal, and l. completely removing the cover metal layer in the at least one second partial area while forming a second conductor structure or a part of a second conductor structure.

I also provide a printed circuit board including: a composite composed of a base substrate as first printed circuit board layer and an insulation layer as second printed circuit board layer, wherein the base substrate includes a first substrate side and a second substrate, the base substrate has at least one trench on the first substrate side, a first conductor structure being embedded into the at least one trench, the base substrate has a planarized surface on the first substrate side, the insulation layer includes a top side and an underside, the first conductor structure is covered by the insulation layer, wherein the underside of the insulation layer is directly in contact with the first conductor structure, and the insulation layer has at least one trench on the top side, a second conductor structure being embedded into the at least one trench.

DETAILED DESCRIPTION

Figure 1:
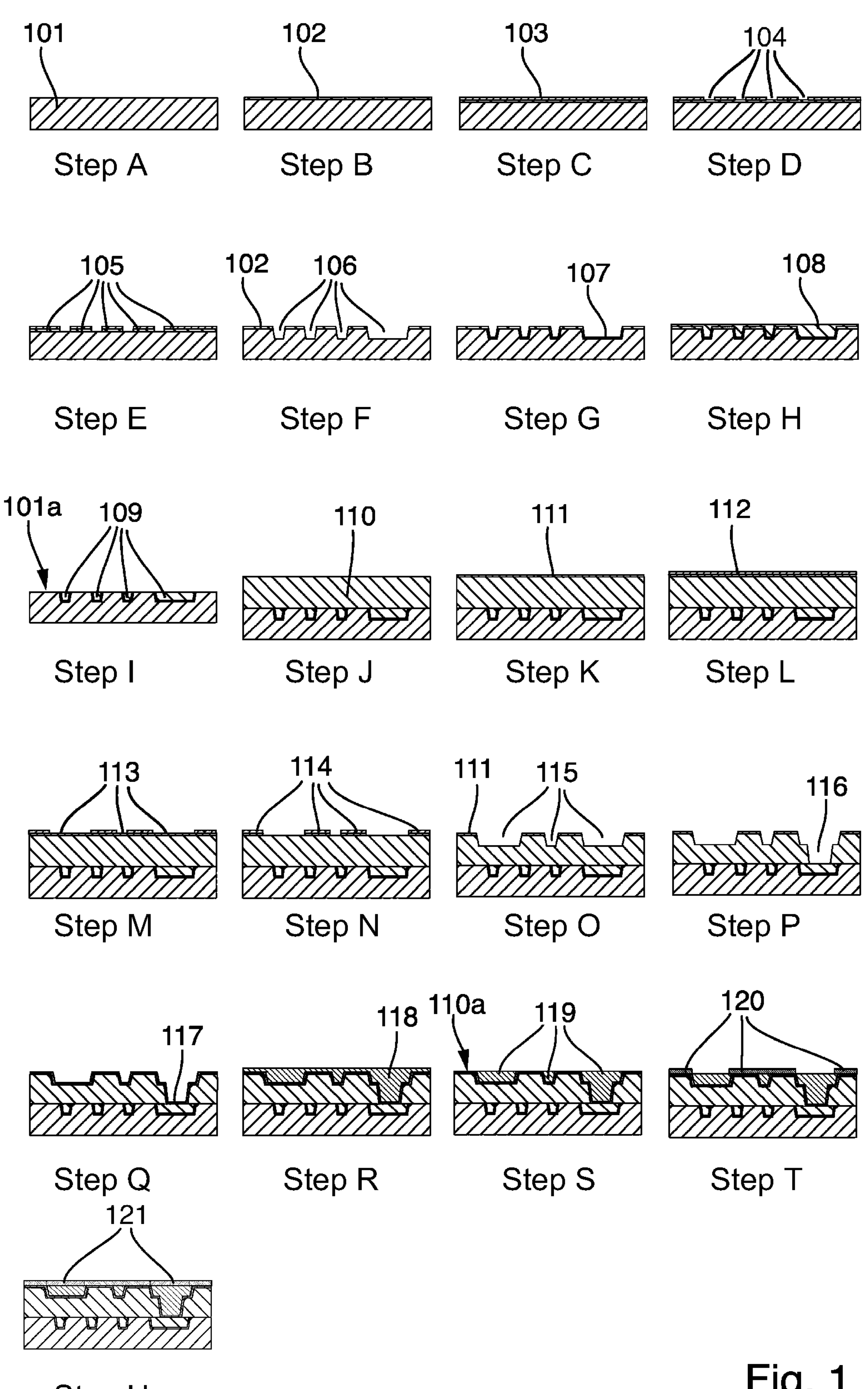
FIG. 1 illustrates a sequence of a method in accordance with Example 3.

My method of producing a printed circuit board comprising a metallic conductor structure always comprises steps a. to e.:

a. providing a base substrate embodied as a film or plate and having a first substrate side and a second substrate side, which base substrate at least partly consists of an electrically non-conductive organic polymer material and when base substrate the first substrate side is covered with a cover metal layer, b. partially removing the cover metal layer while subdividing the first substrate side into at least one first partial region, in which the first substrate side is free of the cover metal layer, and into at least one second partial region, in which the first substrate side is covered with the cover metal layer, c. allowing a plasma to act on the first substrate side, with the aid of which plasma the polymer material is removed in the at least one first partial area while forming at least one trench, d. filling the at least one trench with a filling metal, and e. completely removing the cover metal layer in the at least one second partial area while forming the conductor structure or a part of a conductor structure.

The method is suitable both for producing monolayer printed circuit boards that comprise only one base substrate with one conductor structure in one plane, and producing multilayer printed circuit boards that comprise conductor structures in at least two planes and usually also a plurality of base substrates. In the latter configuration, removing the cover metal layer in step e. results in formation of only part of the entire conductor structure of the printed circuit board. In the first configuration, preferably the entire conductor structure of the printed circuit board is formed in step e.

Particularly preferably, the method additionally comprises step f.:

f. planarizing the first substrate side with the at least one trench that has been filled.

In this respect, even more detailed explanations follow.

Choice of the Base Substrate

Preferably, the method comprises at least one of a. to c.:

a. the base substrate has a thickness of 10 μm to 3 mm, preferably 10 μm to 2 mm, and b. the organic polymer material is selected from the group comprising polyimide, polyamide, b. polytetrafluoroethylene (PTFE) (e.g. Teflon), polyester, polyphenylenesulfide, polyoxymethylene and polyether ketone.

Preferably, a. and b. directly above are realized in combination with one another.

Particularly preferably, the base substrate is a film composed of a polymer material, in particular one of the polymer materials mentioned. This holds true particularly if the printed circuit board to be produced is embodied in a multilayer fashion. A comparatively thicker base substrate embodied as a plate is preferably chosen in a monolayer printed circuit board.

Optionally, the base substrate can comprise fillers, in particular dielectric fillers. By way of example, the base substrate can be a film composed of one of the polymer materials mentioned, into which silicon dioxide particles are embedded.

Appropriate dielectric fillers include, in particular, metal or semimetal oxides (besides silicon dioxide in particular also aluminium oxide, zirconium oxide or titanium oxide) and other ceramic fillers (in particular silicon carbide or boron nitride or boron carbide). Silicon, too, can optionally be used.

The fillers are preferably present in a particulate form, in particular having an average particle size (d50) in the nanorange (<1 μm).

Particularly preferably, the method is thus distinguished by at least one of a. to c.:

a. the base substrate and/or the insulation layer comprise (s) fillers, in particular dielectric fillers, b. the base substrate and/or the insulation layer are/is a plastic film comprising the fillers, and c. the fillers have an average particle size (d50)<1 μm.

Preferably, a. and b., in particular also a. to c., directly above are realized in combination with one another.

To facilitate handling, the base substrate can be applied to a carrier or an auxiliary substrate, for example, composed of glass or aluminium, for processing purposes.

Formation and Properties of the Cover Metal Layer

Further preferably, the method comprises at least one of a. and b.:

a. a layer composed of copper or composed of a copper alloy is chosen as the cover metal layer, and b. the cover metal layer has a thickness of 10 nm to 10 μm, preferably 20 nm to 6 μm.

Preferably, a. and b. directly above are realized in combination with one another.

Ideally, the cover layer should be closed and the preferred minimum thickness mentioned should not be undershot such that the cover metal layer can fulfil its technical function as an etching barrier as explained below.

As an alternative to the copper or the copper alloy, titanium and nickel-chromium alloys are also appropriate as cover metal.

To form the cover metal layer, it is possible, in principle, as the cover metal layer, for a thin metal film, in particular a thin copper film, to be laminated or applied as cladding onto the first substrate side. It is preferred, however, if the method comprises at least one of steps a. to c.:

a. to provide the base substrate, the cover metal layer is formed by physical or chemical vapor deposition on the first substrate side, b. the cover metal layer is formed by sputtering on the first substrate side, and c. the cover metal layer is formed by a wet-chemical coating process.

Preferably, a. and b. directly above are realized in combination with one another.

Metallizations by physical and chemical vapor depositions and also the production of metal layers by wet-chemical coating processes are known and need no further explanation.

Particularly preferably, as the cover metal layer, a copper layer is sputtered onto the base substrate.

It may be preferred for an adhesion-promoting adhesion layer to be applied to the first substrate side before formation of the cover metal layer or during the application of the cover metal layer.

Possible Procedures when Partially Removing the Cover Metal Layer

Further preferably, the method comprises steps a. or b.:

a. partially removing the cover metal layer on the first substrate side is carried out using a masking and a wet-chemical etching step, and b. partially removing the cover metal layer on the first substrate side is carried out by a laser.

Removing the first cover metal layer using the masking and the wet-chemical etching step is a traditional procedure that does not require detailed explanation. For masking purposes, the cover metal layer can be coated with a photoresist in a first step, for example, the photoresist being partially exposed and removed in the exposed regions with the aid of a developer solution, as was described in the introduction. The uncovered cover metal layer is then etched away in the wet-chemical etching step. This can be done, for example, with the aid of etching solutions based on copper chloride or ammonium persulfate.

Alternatively, the cover metal layer can be removed by the laser.

Preferred Examples when Removing the Polymer Material by the Plasma

Further preferably, the method comprises one of steps a. and b.:

a. to provide the plasma, a process gas from the group comprising $O_2$, $H_2$, $N_2$, argon, helium, $CF_4$, $C_3F_8$, $CHF_3$ and mixtures of the aforementioned gases such as $O_2/CF_4$ is used, and b. allowing the plasma to act takes place at a temperature of minus 15° C. to 200° C., preferably minus 15° C. to 80° C.

Preferably, a. and b. directly above are realized in combination with one another.

Particularly preferably, the process gas used for providing the plasma in the context comprises at least one of the reactive gases from the group comprising $CF_4$, $C_3F_8$ and $CHF_3$.

Etching by a plasma is also known. Process gasses that can convert the material to be etched into the gas phase are used during plasma etching. The gas enriched with the etched-away material is pumped away and fresh process gas is fed in. A continuous removal is thus achieved.

Particularly preferably, an inductively coupled plasma (ICP plasma) is used, for example, generated by an ICP generator with a DC bias.

The process gasses mentioned directly above are particularly well suited to the etching of the preferred polymer materials mentioned above.

It is of importance that in the at least one first partial area of the first substrate side, the base substrate consisting of the polymer material can make contact directly with the plasma, while the at least one second partial area of the first substrate side is covered with the cover metal layer. Generally, metals are etched more slowly than polymer materials by a plasma, particularly when the process gasses mentioned are used. Consequently, when the plasma is allowed to act, trenches form exclusively in the region of the at least one first partial area of the first substrate side, while the cover metal layer forms a barrier that shields the at least one second partial area from the plasma. The surface of the base substrate can thus be structured with trenches in a targeted manner.

During the plasma treatment, moreover, if appropriate, in the second partial area residual photoresist is also removed from the first substrate side. Consequently, separate resist stripping is not absolutely necessary.

Particularly preferably, the plasma is used in the context of an anisotropic etching process. Ideally, in this configuration, ions of the plasma are accelerated perpendicularly to the surface of the substrate to be etched. The accelerated ions provide for physical sputtering removal.

Examples of reactive ion etching (RIE) and of reactive ion beam etching (RIBE) are particularly suitable as an anisotropic etching process.

Accordingly, preferably, the method is distinguished by at least one of a. to c.:

a. the plasma in step c. and/or j. is used in the context of an anisotropic etching process, b. during the anisotropic etching process, ions of the plasma are accelerated perpendicularly to the first substrate side and/or to the top side, and c. the process gas used to provide the plasma comprises at least one of the reactive gases from the group comprising $CF_4$, $C_3F_8$ and $CHF_3$.

Preferably, a. and b. directly above, particularly preferably a. to c. directly above, are realized in combination with one another.

Surprisingly, we found that the presence of the particulate fillers mentioned above has a particularly advantageous effect on the result of the material removed by the plasma.

By the plasma it is not only possible to introduce trenches into the first substrate side, rather it is also possible to deepen further trenches that already exist in the surface of the first substrate side, for example, to produce blind holes or even through holes in the base substrate. For this purpose, the method can comprise the additional steps a. and b.:

a. before step a., in the context of a pretreatment, at least one trench is introduced into the first substrate side, and b. to provide the base substrate in step a., the first substrate side with the at least one trench is covered with the cover metal layer.

If a base substrate that has been pretreated in this way is subjected to the plasma treatment described, then the latter results in the described formation of the at least one trench in the at least one first partial area of the first substrate side; and where the trenches introduced into the base substrate during the pretreatment overlap the first partial region, they are deepened further by the plasma treatment.

Introducing the at least one trench in the context of the pretreatment is preferably likewise carried out by allowing a plasma to act, analogously to step c. To form a mask required for this purpose, the pretreatment can also comprise photolithographic steps.

Selection and Application of the Filling Metal

Further preferably, the method comprises one of a. to c.:

a. to fill the at least one trench, the at least one trench is metallized in one step and the metallized at least one trench is filled with the filling metal in a subsequent step,
b. the metallization of the at least one trench is carried out by physical or chemical vapor deposition, in particular by sputtering of the first substrate side, or by a wet-chemical method, and
c. the first substrate side is metallized over the whole area.

Preferably, a. and b., in particular a. to c., directly above are realized in combination with one another.

Preferably, a thin layer composed of copper or a copper alloy is formed in the context of the metallization.

In a wet-chemical metallization, the metallization is effected by depositing copper from a solution, for example.

Filling with the filling metal is preferably carried out by electrochemical deposition. Particularly preferably, filling is carried out by a so-called via fill method that enables the deposition to be carried out primarily in the at least one trench and optionally in drilled holes or blind holes while simultaneously minimizing an undesired deposition on the first substrate side, while reinforcing the cover metal layer in the at least one second partial region.

A metallization layer applied over the whole area enables an electrical contacting of the first substrate side to be able to position there a cathodic contact for a subsequent electrochemical deposition and to ensure that the entire substrate side can be coated.

In principle, all metals and alloys from which conductor track structures can be produced on printed circuit boards are suitable as filling metal. It is particularly preferred, however, for a. the filling metal with which the at least one trench is filled to be copper or a copper alloy.

Possible Procedures During Complete Removal of the Cover Metal Layer/Planarization Further preferably, the method comprises one of a. or b.:

a. removing the cover metal layer in the at least one second partial area is carried out by an etching step, and
b. removing the cover metal layer in the at least one second partial area is carried out by mechanical processing of the first substrate side.

The etching step is, for example, a traditional etching step using a strong acid such as hydrochloric acid.

If the cover metal layer is removed mechanically, then the cover metal layer can be removed by polishing and/or by grinding, for example. The aim is to completely remove the cover metal layer in the at least one second partial region. It is only by this means that the formation of the conductor structure or of the part of the conductor structure is concluded.

Completely removing the cover metal layer preferably also comprises removing filling metal in the at least one partial area and optionally also in the area of the at least one trench insofar as the filling metal projects beyond the edge or the edges of the at least one trench.

Particularly advantageously, during the mechanical processing of the first substrate side, it is possible not only to remove the cover metal layer but at the same time also to accomplish the planarization of the first substrate side. The aim of the planarization is to level the first substrate side such that it has no conductor tracks projecting from the surface. Instead, the conductor structure is preferably sunk completely in the at least one trench.

Production of MLBs

In the base substrates treated in accordance with the method, the conductor structure formed lies within the base substrate in one plane. However, the method also enables the production of MLBs, that is to say of printed circuit boards comprising conductor structures in different planes.

There are three particularly preferred examples of producing MLBs:

Example 1

In this example, the method is distinguished by the two additional steps a. and b.:

a. the base substrate is provided with a first and a second substrate side, both of which are covered with a cover metal layer, and
b. both substrate sides are subjected to a treatment by steps b. to e. to form a conductor structure, optionally also by b. to f.

In Example 1, step b. thus necessarily comprises in detail partially removing the cover metal layer on the first and second substrate sides while respectively subdividing the substrate sides into at least one first partial region, in which the substrate sides are free of the cover metal layer, and into at least one second partial region, in which the substrate sides are covered with the cover metal layer, allowing a plasma to act on the substrate sides, with the aid of which plasma in the at least one first partial area the polymer material is removed while respectively forming at least one trench, respectively filling the at least one trench with a filling metal, and completely removing the cover metal layers in the at least one second partial region, while forming a conductor structure.

Preferably, the substrate sides are treated successively.

Example 2

In this example, the method according is distinguished by a. to c.:

a. providing a base substrate, on whose first substrate side a conductor structure has been formed in accordance with steps b. to f. and whose second substrate side is free of a cover metal,
b. applying a cover metal layer to the second substrate side, and
c. forming a conductor structure on the second substrate side by the second substrate side being subjected to a treatment by b. to e., optionally also by b. to f.

In Example 2, step c. thus necessarily comprises in detail partially removing the cover metal layer on the second substrate side while subdividing the second substrate side into at least one first partial region, in which the second substrate side is free of the cover metal layer, and into at least one second partial region, in which the second substrate side is covered with the cover metal layer, allowing a plasma to act on the second substrate side, with the aid of which plasma in the at least one first partial area the polymer material is removed while forming at least one trench, filling the at least one trench with a filling metal, and completely removing the cover metal layers in the at least one second partial area while forming a conductor structure.

Example 3

In this example, the method is distinguished by additional a. to d.:

a. a base substrate, the first substrate side of which, while forming the conductor structure, has been subjected to a treatment in accordance with steps b. to e., preferably in accordance with steps b. to f., is provided with the conductor structure as first conductor structure as first printed circuit board layer to form a multilayer printed circuit board,
b. covering the first conductor structure with an insulation layer, which in a composite assembly with the base substrate has an underside directly in contact with the conductor structure and a top side facing away from the conductor structure and which at least partly consists of an electrically non-conductive organic polymer material,
c. if not yet present, forming a cover metal layer on the top side of the insulation layer, and
d. carrying out a treatment of the top side of the insulation layer analogously to b. to e. while forming a second printed circuit board layer having a second conductor structure.

In Example 3, d. thus comprises in detail partially removing the cover metal layer on the top side while subdividing the top side into at least one first partial region, in which the top side is free of the cover metal layer, and into at least one second partial region, in which the top side is covered with the cover metal layer, allowing a plasma to act on the top side, with the aid of which plasma the polymer material is removed in the at least one first partial area while forming at least one trench, filling the at least one trench with a filling metal, and completely removing the cover metal layer in the at least one second partial area while forming the second conductor structure.

While Examples 1 and 2 result in a base substrate with both substrate sides thereof provided respectively with a conductor structure sunk in at least one trench, Example 3 results in a multilayer printed circuit board comprising at least two printed circuit board layers each having a conductor structure. It goes without saying that base substrates treated in accordance with Examples 1 and 2, in which a conductor structure is already found respectively on the first substrate side and on the second substrate side, can also serve as first printed circuit board layer and be processed further in accordance with Example 3.

Example 3 enables sequential construction of printed circuit boards having, in principle, as many printed circuit board layers as desired. In this regard, by way of example, a further insulation layer can be applied to the second conductor structure and be subjected to the same treatment as the insulation layer applied to the first conductor structure. These steps can be repeated as often as desired.

In Examples 1 and 2, the preferred developments already described above are each applicable for carrying out b. to f., the selection and constitution of the base substrates and the selection and the application of the cover metal layers and of the filling metal.

For Example 3, the insulation layer can be embodied like the base substrate provided in a. Particularly preferably, the insulation layer is a film composed of one of the electrically non-conductive organic polymer materials mentioned. The preferred developments disclosed in connection with the treatment of the base substrate are likewise applicable for the application, carried out in accordance with Example 3, on and the partial removal of the cover metal layer from the insulation layer, the plasma treatment, the filling of the at least one trench and the complete removal of the cover metal layer.

Application of the insulation layer in Example 3 is preferably carried out by lamination, coating or by adhesive bonding.

Vias

Printed circuit boards produced in accordance with Example 3 have conductor structures in different layers. To electrically connect the conductor structures to one another, vias are required. Procedures A and B are particularly preferred for forming the vias:

Procedure A

The method with Example 3 is distinguished by the two directly following additional a. and b.:

a. during the treatment of the top side, between the plasma treatment and the process of filling with the filling metal, at least one trench formed on the top side is connected to a trench in the first printed circuit board layer, the trench already having been filled with the filling metal, by a hole, and
b. filling the at least one trench with the filling metal also comprises filling the hole.

The via can thus be integrated elegantly into the method without significant additional outlay arising.

The drilled hole is particularly preferably a laser drilled hole.

Moreover, conductor structures formed in accordance with Examples 1 and 2 can also be electrically contacted analogously to this. If a conductor structure is formed on the second substrate side in accordance with Example 2 after allowing the plasma to act on the second substrate side, one or more of the trenches formed in the process can be connected to the conductor structure on the first substrate side by a drilled hole. The electrical contacting is then effected during the subsequent process of filling the drilled hole and the trenches with the filling metal.

Procedure B

The method in accordance with Example 3 comprises a. to f.:

a. a base substrate, the first substrate side of which, while forming a conductor structure, has been subjected to a treatment in accordance with b. to e., preferably in accordance with b. to f., is provided with the conductor structure formed as first conductor structure as first printed circuit board layer to form a multilayer printed circuit board,
b. the first conductor structure is covered with an insulation layer, which in a composite assembly with the base substrate has an underside directly in contact with the conductor structure and a top side facing away from the conductor structure and which at least partly consists of an electrically non-conductive organic polymer material,
c. before or after b, introducing at least one first trench into the top side of the insulation layer, in particular by allowing a plasma to act,
d. if not yet present, forming a cover metal layer on the top side with the at least one first trench,
e. partially removing the cover metal layer while subdividing the top side into at least one first partial region, in which the top side is free of the cover metal layer, and into at least one second partial region, in which the top side is covered with the cover metal layer, wherein the at least one first partial area comprises the at least one first trench introduced previously in the top side of the insulation layer, and f. allowing a plasma to act on the top side, with the aid of which plasma the polymer material is removed in the at least one first partial area while forming at least one second trench.

As a result of allowing the plasma to act in f., the at least one trench introduced into the top side of the insulation layer in c. is deepened further, at least insofar as it lies in the at least one first partial region. Given a sufficiently long time of action, this can result in a perforation which, given corresponding metallization and/or filling with a filling metal, can serve to form a via contact, in particular to the first conductor structure.

The treatment of the top side of the insulation layer that is performed in c. is preferably effected by the above-described pretreatment of the base substrate.

Concluding Method Steps

Preferably, outer conductor structures formed in accordance with the method are coated with a solder resist for their protection. Free contacts can be coated with a noble metal, for example, with gold, silver or platinum.

Features and properties of printed circuit boards produced in accordance with the method A printed circuit board produced in accordance with the above method is distinguished by:

a. it comprises a base substrate having a first and a second substrate side, b. the base substrate has at least one trench on the first substrate side, a conductor structure being embedded into the at least one trench, and c. the base substrate has a planarized surface on the first substrate side.

Preferably, the printed circuit board is distinguished by a.:

a. it has a multilayer construction and comprises the base substrate as a first printed circuit board layer having a first conductor structure and also an insulation layer as a second printed circuit board layer having a second conductor structure.

Further printed circuit board layers can be provided. Preferably, the printed circuit board has between 2 and 20 printed circuit board layers.

Numerous preferred features relating to the printed circuit board produced and relating to the base substrate and the insulation layer have already been disclosed in the description of the method. It should be emphasized that the base substrate and the insulation layer are particularly preferably films.

Advantages

It is thus possible to produce printed circuit boards with extremely high resolution in the μm range, specifically with less complexity and lower production costs in conjunction with a higher yield in comparison with what the prior art allows. The disadvantages of the subtractive and also additive and semi-additive methods are avoided.

The fact that the conductor structures are sunk in the base substrate has a positive effect during the production of MLBs, particularly in the sequential construction described. The pressures acting on the conductor structures when base substrates are joined together are comparatively low, which has a positive effect with regard to existing impedance and signal speed requirements. The fact that channels can be formed with extremely high precision by plasma etching also has a positive effect in this regard.

In principle, such channels would also be able to be formed with the aid of a laser. By comparison therewith, plasma etching affords the advantage that during plasma etching all channels and other trenches can be formed simultaneously and in one step, which is generally faster and more cost-effective by a multiple. Furthermore, higher resolutions can be obtained by plasma etching.

Further features, details and preferences are evident from the appended claims, the wording of which is incorporated by reference in the content of the description and to the drawing.

In accordance with FIG. 1, in a step A, a base substrate 101 is provided. In step B, the base substrate is covered with a cover metal layer 102 on its first substrate side 101*a*. To partly remove the cover metal layer 102, in step C, a resist 103 is applied to the cover metal layer 102, the resist being exposed and removed in the first partial regions 104 in step D. In step E, the cover metal layer 102 is removed by an etching solution in the first partial regions 104, which are no longer covered by the resist 103. The substrate side 101*a*, originally completely covered with the cover metal layer 102, is now subdivided into the first partial regions 104, in which the substrate side is free of the cover metal layer 102, and into the second partial regions 105, in which the substrate side is still covered with the cover metal layer 102. In step F, a plasma is allowed to act on the substrate side 101*a*. While the partial regions 105 are shielded from the plasma by the cover metal layer 102, in the partial regions 104 the plasma brings about material removal and consequently formation of the trenches 106. At the same time, the resist 103 is also completely removed in the process. In step G, the trenches 106 are metallized by sputtering, followed by filling the trenches 106 by electrochemical deposition of a filling metal 108 in step H. In step I, excess filling metal 108 is then mechanically removed together with the cover metal layer 102 in the partial regions 105. The conductor structure 109 sunk in the trenches 106 is formed in the process.

To form an MLB, in step J, an insulation layer 110 is laminated directly onto the substrate side 101*a* having the conductor structure 109. In step K, the top side 110*a* of the insulation layer is covered with a cover metal layer 111, which is partially removed again in steps L, M and N (analogously to steps C, D and E) by applying a resist 112 and partially removing the latter using an etching solution. The top side 110*a* of the insulation layer 110, originally completely covered with the cover metal layer 111, is now subdivided into the first partial regions 113, in which the top side is free of the cover metal layer 111, and into the second partial regions 114, in which the top side is still covered with the cover metal layer 111. In step O, a plasma is allowed to act on the top side 110*a* of the insulation layer 110. While the partial regions 114 are shielded from the plasma by the cover metal layer 111, in the partial regions 113 the plasma brings about material removal and consequently formation of the trenches 115. At the same time, the resist 112 is also completely removed in the process. In step P, one of the trenches 115 formed is connected by a drilled hole 116 to a trench 106 of the first conductor structure 109 that has already been filled with the filling metal 108. In step Q, the trenches 115 including the drilled hole 116 are metallized by sputtering, followed by filling the trenches 115 by electrochemical deposition of a filling metal 118 in step R. In step S, excess filling metal 118 is then mechanically removed together with the cover metal layer 111 in the partial regions 114. The conductor structure 119 sunk in the trenches 115 is formed in the process. In step T, a solder resist 120 is applied, followed by partial gold plating 121 of individual contacts of the conductor structure 119.

A reduction of the number of individual steps of the method described can be achieved by a structuring of the cover metal layers being performed by a laser instead of the photolithographic structuring of the cover metal layers 102 and 111 in steps C to E and L to N.

Figure 2:
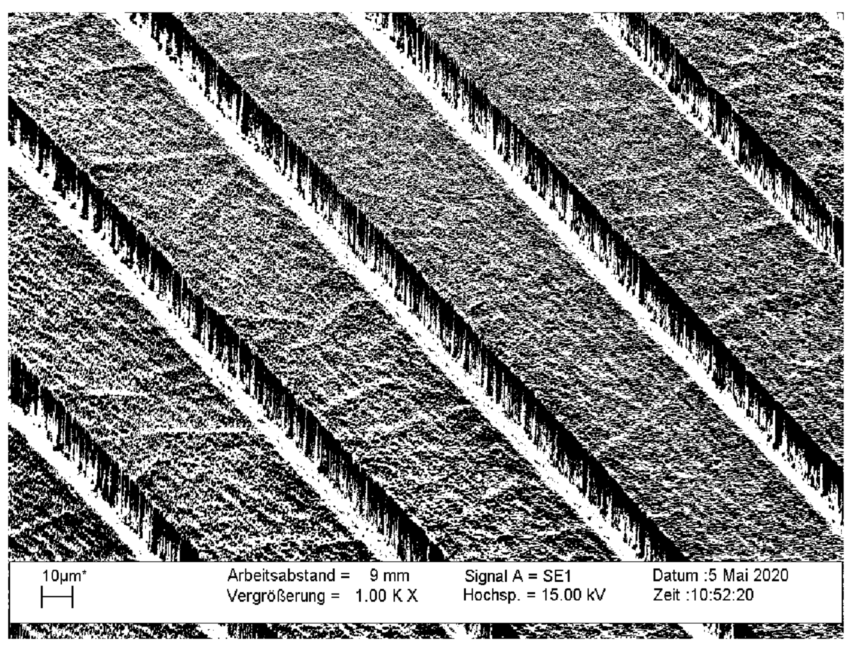
FIGS. 2 and 3 illustrate micrographs of base substrates etched by a plasma in the context of the method.
Figure 3:
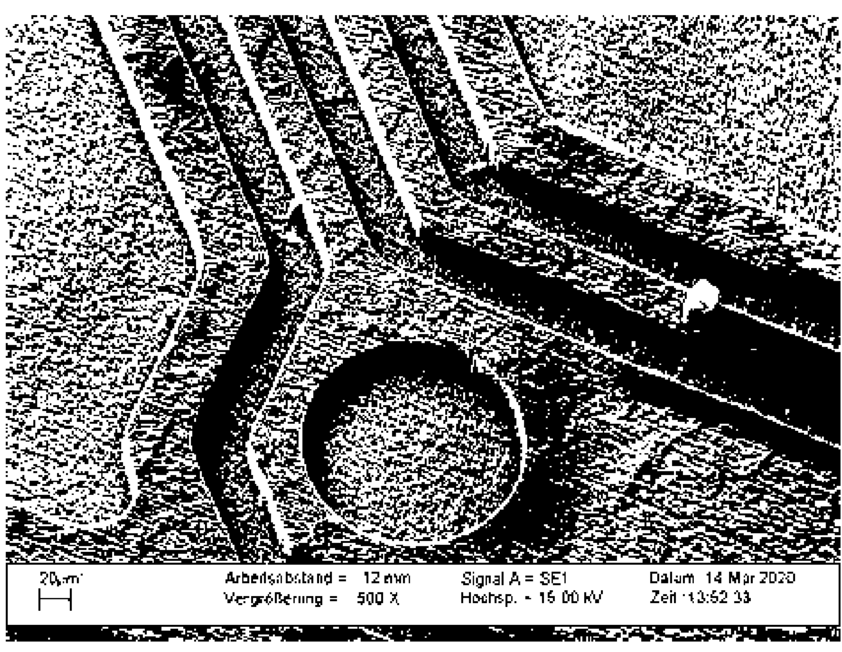

The base substrates illustrated in FIGS. 2 and 3 were treated by RIE in step F of the method sequence illustrated in FIG. 1, and illustrate the result of the plasma treatment.

The invention claimed is:

1. A method of producing a multilayer printed circuit board comprising a metallic conductor structure, comprising:

a. providing a base substrate comprising a film or plate and having a first substrate side and a second substrate side, which base substrate at least partly consists of an electrically non-conductive organic polymer material and wherein the first substrate side is covered with a cover metal layer, the cover metal layer is formed directly on the substrate by vapor deposition, sputtering or a wet-chemical coating process, b. partially removing the cover metal layer while subdividing the first substrate side into at least one first partial area, in which the first substrate side is free of the cover metal layer, and into at least one second partial area, in which the first substrate side is covered with the cover metal layer, c. causing a plasma to act on the first substrate side with the aid of which plasma the polymer material is removed in the at least one first partial area while forming at least one trench, wherein the plasma is an inductively coupled plasma (ICP plasma) generated by an ICP generator with a DC bias, d. filling the at least one trench with a filling metal, and e. completely removing the cover metal layer in the at least one second partial area while forming a first conductor structure or a part of a first conductor structure, f. planarizing the first substrate side with the at least one trench that has been filled, wherein the planarizing of the first substrate side at least comprises removing the cover metal layer in the at least one second partial area by an etching step or removing the cover metal layer in the at least one second partial area by mechanical processing of the first substrate side, g. covering the first conductor structure with an insulation layer, which in a composite assembly with the base substrate has an underside directly in contact with the first conductor structure and a top side facing away from the first conductor structure and which at least partly consists of an electrically non-conductive organic polymer material, h. if not yet present, forming a cover metal layer on the top side of the insulation layer, i. partially removing the cover metal layer while subdividing the top side into at least one first partial area, in which the top side is free of the cover metal layer, and into at least one second partial area, in which the top side is covered with the cover metal layer, j. causing a plasma to act on the top side, with the aid of which plasma the polymer material is removed in the at least one first partial area while forming at least one trench, k. filling the at least one trench with a filling metal, and l. completely removing the cover metal layer in the at least one second partial area while forming a second conductor structure or a part of a second conductor structure.

2. The method according to claim 1, wherein at least one of:

the base substrate and/or the insulation layer have/has a thickness of 10 μm to 3 mm, and the organic polymer material is selected from the group consisting of polyimide, polyamide, polytetrafluoroethylene, polyester, polyphenylenesulfide, polyoxymethylene and polyether ketone.

3. The method according to claim 1, wherein at least one of:

the base substrate and/or the insulation layer comprise(s) a filler, and the base substrate and/or the insulation layer are/is a plastic film composed of the electrically non-conductive organic polymer material and comprise(s) a filler.

4. The method according to claim 3, wherein the filler has an average particle size $d50<1$ μm.

5. The method according to claim 3, wherein the filler is a dielectric filler.

6. The method according to claim 1, wherein at least one of:

a layer composed of copper or composed of a copper alloy is chosen as the cover metal layer on the first substrate side and/or as the cover metal layer on the top side of the insulation layer, the cover metal layer on the first substrate side and/or the cover metal layer on the top side of the insulation layer have/has a thickness of 10 nm to 10 μm, to provide the base substrate, the cover metal layer is formed by physical or chemical vapor deposition on the first substrate side and/or the cover metal layer is formed on the top side of the insulation layer by physical or chemical vapor deposition, the cover metal layer is formed by sputtering on the first substrate side and/or the cover metal layer is formed by sputtering on the top side, and the cover metal layer on the first substrate side and/or the cover metal layer on the top side of the insulation layer are/is formed by a wet-chemical coating process.

7. The method according to claim 1, further comprising one of:

partially removing the cover metal layer on a first substrate side and/or partially removing the cover metal layer on a top side are/is carried out using a masking and a wet-chemical etching step, and partially removing the cover metal layer on the first substrate side and/or partially removing the cover metal layer on the top side are/is carried out by a laser.

8. The method according to claim 1, wherein at least one of:

to provide the plasma, a process gas selected from the group consisting of $O_2$, $H_2$, $N_2$, argon, helium, $CF_4$, $C_3F_8$, $CHF_3$ and mixtures of the aforementioned gases is used, and causing the plasma to act takes place at a temperature of minus 15° C. to 200° C.

9. The method according to claim 1, wherein during step c. and/or j, the plasma is used in at least one of an anisotropic etching process, and an anisotropic etching process, wherein ions of the plasma are accelerated perpendicularly to the first substrate side and/or to the top side, and wherein the process gas used to provide the plasma comprises at least one of the reactive gases from the group consisting of $CF_4$, $C_3F_8$ and $CHF_3$.

10. The method according to claim 1, wherein at least one of:

to fill the at least one trench of step c. and/or the at least one trench of step j., the at least one trench of step c. and/or the at least one trench of step j are/is metallized in one step and the metallized at least one trench of step c. and/or the at least one trench of step j is filled with the filling metal of step d and/or the filling metal of step k in a subsequent step, the metallization of the at least one trench of step c and/or of the at least one trench of step j is carried out by physical or chemical vapor deposition or sputtering of the first substrate side and/or of the top side, or wet-chemically, and the first substrate side and/or the top side are/is metallized over the whole area.

11. The method according to claim 1, wherein the filling metal of step d and/or the filling metal of step k with which side at least one trench of step c. and/or the at least one trench of step j is filled is copper or a copper alloy.

12. The method according to claim 1, wherein removing the cover metal layer on the first substrate side and/or the cover metal layer on the top side of the insulation layer in the at least one second partial area is carried out by an etching step and/or by mechanical processing of the first substrate side and/or the top side.

13. The method according to claim 1, wherein:

the base substrate having the first and the second substrate side has a cover metal layer on both substrate sides, and both substrate sides are subjected to a treatment by b, to e, to form a conductor structure.

14. The method according to claim 1, wherein the second substrate side of the base substrate is free of a cover metal, and the method further comprises:

applying a cover metal layer to the second substrate side, after performing steps b. to f. on the first substrate side, and forming a conductor structure on the second substrate side by a treatment of the second substrate side by steps b. to e.

15. The method according to claim 1, wherein:

during treatment of the top side, between the plasma treatment and the process of filling with the filling metal, at least one trench formed on the top side is connected to a trench in the first printed circuit board layer, said trench in the first printed circuit board layer already having been filled with the filling metal, by a hole, and filling the at least one trench on the top side with the filling metal also comprises filling the hole.

16. The method according to claim 1, wherein:

before or after step g., introducing at least one first trench into the top side of the insulation layer, and during the process of partially removing the cover metal layer in step i., the first partial area comprises the at least one first, previously introduced trench in the top side of the insulation layer.

17. The method according to claim 1, wherein the process gas is a mixture of $O_2$ and $CH_4$.

* * * * *